United States Patent [19]

Kamio et al.

[11] Patent Number: 4,529,790
[45] Date of Patent: Jul. 16, 1985

[54] EPOXY RESIN COMPOSITION

[75] Inventors: Kunimasa Kamio, Suita; Hisao Takagishi, Kyoto; Shuichi Kanagawa, Osaka, all of Japan

[73] Assignee: Sumitomo Chemical Company, Limited, Osaka, Japan

[21] Appl. No.: 636,240

[22] Filed: Jul. 31, 1984

[30] Foreign Application Priority Data

Aug. 12, 1983 [JP] Japan .................................. 58-148438
Feb. 13, 1984 [JP] Japan .................................. 59-25664

[51] Int. Cl.³ ............................................. C08G 59/08
[52] U.S. Cl. .............................. 528/107; 264/272.13; 264/272.17; 525/504; 525/507
[58] Field of Search ................. 525/504, 507; 528/107

[56] References Cited

U.S. PATENT DOCUMENTS 3,449,641  6/1969  Lee ................................... 525/507 X
3,577,437  5/1971  Le Blanc ........................... 525/507 X
4,468,508  8/1984  Ito et al. ............................ 525/507

*Primary Examiner*—Earl Nielsen
*Attorney, Agent, or Firm*—Stevens, Davis, Miller & Mosher

[57] ABSTRACT

An epoxy resin composition comprising a polyglycidyl ether prepared by reacting a 3-methyl-6-alkylphenol in the presence or absence of a phenol other than the 3-methyl-6-alkylphenol with an aldehyde to obtain a novolak, and then reacting the novolak with an epihalohydrin, which composition is useful in electronic fields, for example, for encapsulating semiconductor products or for the production of printed circuit boards.

10 Claims, No Drawings

EPOXY RESIN COMPOSITION

The present invention relates to an epoxy resin composition. More specifically, the invention relates to an epoxy resin composition particularly useful in an electronic industry.

Epoxy resins have been widely used for paints, electric appliances and the like, as well as in public and construction works, because of their excellent mechanical, electric and chemical properties. In recent years, the epoxy resins have been increasingly used as a material for encapsulating semiconductor products such as IC and LSI, and also used for printed circuit boards equipped with the semiconductor products with rapid progress of an electronic industry.

As the epoxy resins, o-cresol novolak type epoxy resins are mainly used as the material for encapsulating semiconductor products and a modifier for improving moisture resistance, thermal resistance and dimensional stability of the printed circuit boards.

However, a higher reliability on the cured product of said novolak type epoxy resins has been required with increase in an integration degree of the semiconductor products. In order to heighten the reliability, it is strongly required to improve the moisture resistance, but the existing o-cresol novolak type epoxy resins can hardly meet with this requirement.

The present inventors have undertaken extensive studies to find an epoxy resin having such performances superior to those of the o-cresol novolak type epoxy resins, and found that an epoxy resin obtainable using a 3-methyl-6-alkylphenol can accomplish the object.

The present invention provides an epoxy resin composition comprising a polyglycidyl ether prepared by reacting a 3-methyl-6-alkylphenol in the presence or absence of a phenol other than the 3-methyl-6-alkylphenol with an aldehyde to obtain a novolak, and reacting the novolak with an epihalohydrin.

The polyglycidyl ether having the 3-methyl-6-alkylphenol component, in other words, the epoxy resin of the present invention is novel and has a markedly improved moisture resistance, and can give a semiconductor product with a high reliability without any trouble such as degradation of electrodes due to the corrosion, the electrodes being, for example, made of a film formed by vacuum-vaporization of metals such as aluminum. Moreover, a blend of the epoxy resin of the present invention as a modifier and bisphenol A type epoxy resins, tetrabromobisphenol A type epoxy resins and the like can give a cured product having excellent thermal resistance, water resistance and dimensional stability, and is therefore useful for production of the printed circuit boards.

In the present invention, the alkyl in the 3-methyl-6-alkylphenol usable as a starting material is intended to mean an alkyl group having 4 to 8 carbon atoms, such as butyl, pentyl, hexyl, heptyl, octyl and isomers thereof.

The other phenol usable for the copolycondensation along with the 3-methyl-6-alkylphenol includes phenol, substituted phenols and polyhydric phenols.

The substituted phenols are those substituted with alkyl, alkenyl, aryl, allyl, aralkyl or halogen, and include, for example, cresol, xylenol, ethylphenol, iropropylphenol, allylphenol, phenylphenol, benzylphenol, chlorophenol, bromophenol and the like, all of which include o-, m- and p-isomers.

The polyhydric phenols include, for example, resorcinol, catechol, hydroquinone and the like.

The aforesaid phenols may be used each alone or in a mixture of two or more.

These phenols may be used in any amount unless the polyglycidyl ether of the present invention is adversely affected, but usually in an amount less than that of the 3-methyl-6-alkylphenol.

The novolak usable in the present invention can be prepared using the 3-methyl-6-alkylphenol and if desired, the other phenol in a manner usually applied for the production of a conventional phenol novolak. For example, said phenols may be subjected to polycondensation with an aldehyde (e.g. formaldehyde, paraformaldehyde, etc.) in the presence of a catalyst (e.g. inorganic acids such as hydrochloric acid, phosphoric acid, sulfuric acid, etc., organic acids such as benzenesulfonic acid, toluenesulfonic acid, oxalic acid, etc., and metal salts such as zinc acetate, etc.).

The polyglycidyl ether of the present invention can be produced using the novolak obtained above in a conventional manner. For example, the novolak may be subjected to reaction with an epihalohydrin such as epichlorohydrin in the presence of an alkali such as sodium hydroxide.

The epoxy resin composition of the present invention comprises the polyglycidyl ether obtained and a curing agent.

The curing agent usable includes, for example, dicyandiamide, hydrazides such as sebacic acid dihydrazide, succinic acid dihydrazide, adipic acid dihydrazide, tartaric acid dihydrazide and the like, novolaks such as phenol novolak, cresol novolak, resorcinol novolak, cocondensation novolaks thereof and the like, amines such as diaminodiphenylmethane, diaminodiphenylsulfone, 3,3'-dichloro-4,4'-diaminodiphenylmethane and the like, and acid anhydrides such as benzophenone-tetracarboxylic acid dianhydride, pyromellitic anhydride, trimellitic anhydride and the like.

The curing agent may be used in an amount ranging from 0.5 to 1.5 equivalents per epoxy group of the polyglycidyl ether. An amount either less than 0.5 equivalent or more than 1.5 equivalents fails to give desired performances because of insufficient cure.

The epoxy resin composition of the present invention may contain a conventional epoxy resin, besides the polyglycidyl ether obtained above, depending on the purpose of uses. The conventional epoxy resin may be used in any proportion unless the present composition is adversely affected. Usually, the weight proportion of the polyglycidyl ether to the conventional epoxy resin is between 5/95 and 100/0.

Typical examples of the conventional epoxy resin are bisphenol A type epoxy resins and tetrabromobisphenol A type epoxy resins.

The epoxy resin composition of the present invention may further contain other additives including curing accelerators such as tertiary amines, amine complexes, imidazol compounds and the like, fillers such as silica, alumina, aluminum hydroxide and the like, fire retardants such as antimony trioxide and the like, coloring agents, surface-processing agents such as silan coupling agents and the like, release agents and the like.

The thus obtained epoxy resin composition of the present invention can be effectively used for encapsulating semiconductor products and as a varnish for the production of printed circuit boards.

In encapsulating semiconductor products, the epoxy resin composition comprising the present polyglycidyl ether, the curing agent and the filler, and if desired other additives suitable for the intended use may be melt-kneaded with a roller or an extruder, and cooled to form a solid, which may be then pulverized to obtain a molding compound usable in the encapsulation. The molding compound may be molded in a conventional manner such as transfer molding to perform the encapsulation.

The varnish usable in the production of printed circuit boards may be prepared by uniformly dissolving the present epoxy resin composition preferably comprising the conventional epoxy resin in addition to the present polyglycidyl ether in an organic solvent. The solvent usable includes, for example, ketones such as acetone, methyl ethyl ketone and the like, esters such as ethyl acetate, butyl acetate and the like, aromatic hydrocarbons such as benzene, toluene, xylene and the like, alcohols such as ethyl alochol, ethyleneglycol monomethylether, halohydrocarbons such as trichloroethylene, perchloroethylene and the like, dimethylformamide and the like. The solvent may be used in a mixture of two or more. The varnish prepared may be impregnated into reinforcing materials such as glass fibers to obtain a prepreg. The prepreg in several sheets may be put one over another and then cured to obtain a laminate product useful as printed circuit boards. The thus obtained product cured is excellent thermal resistance, water resistance, dimensional stability and electric characteristics.

The present invention is illustrated in more detail with reference to the following Examples and Comparative Examples, wherein parts are by weight, unless otherwise specified.

EXAMPLE 1

In a reactor equipped with a thermometer, a reflux condensor and a stirrer, a mixture of 3-methyl-6-t-butylphenol (hereinafter referred to as 3M6B for brevity, 246 parts), a 37.6% aqueous solution of formaldehyde (72 parts) and p-toluenesulfonic acid (4 parts) was refluxed for 4 hours, while being stirred. Toluene (300 parts by volume) was added thereto to dissolve the reaction mixture, and then a 10% aqueous solution of sodium hydroxide (8.4 parts) was added thereto to neutralize the p-toluenesulfonic acid. The toluene layer separated was concentrated in vacuo to obtain a 3M6B novolak (230 parts) having a softening point of 89° C.

In a reactor equipped with a means for recovering by-produced water a mixture of the 3M6B novolak (106 parts) and epichlorohydrin (500 parts) was heated at 100° C., and thereafter a 48.8% aqueous solution of sodium hydroxide (55 parts) was added continuously dropwise to the mixture taking over 5 hours, during which water byproduced was continuously removed out of the reaction system as an azeotrope. After the reaction was over, the excess epichlorohydrin was evaporated under atmospheric pressure and then under 10 mmHg at 140° C. The residue comprising a desired resin and a by-produced inorganic salt was mixed with toluene (300 parts), and the mixture was filtered to separate the insoluble inorganic salt. The filtrate was concentrated to obtain a desired epoxy resin (polyglycidyl ether of 3M6B novolak, 136 parts). The epoxy resin was found to have an epoxy equivalent of 260 g/eq., a hydrolyzable chlorine content of 0.02% and a softening point of 90° C.

EXAMPLE 2

In a manner similar to that of Example 1, provided that 3M6B (164 parts), o-cresol (54 parts) and a 37.6% aqueous solution of formaldehyde (80 parts) were used, there was obtained a 3M6B/o-cresol copolycondensation novolak (211 parts) having a softening point of 94° C.

Successively, epoxidization was carried out using the novolak obtained above (94 parts) in a manner similar to that of Example 1, whereby there was obtained a desired epoxy resin (polyglycidyl ether of 3M6B/o-cresol novolak) having an epoxy equivalent of 245 g/eq., a hydrolyzable chlorine content of 0.03% and a softening point of 86° C.

EXAMPLES 3 and 4

In a manner similar to that of Example 2, each polyglycidyl ether of copolycondensation novolak as shown in Table 1 was obtained.

EXAMPLE 5

Example 1 was repeated, provided that 3-methyl-6-t-octylphenol (referred to as 3M6O) was used in place of 3M6B, whereby there was obtained a polyglycidyl ether of the 3M6O novolak.

COMPARATIVE EXAMPLE 1

In a manner similar to that of Example 1, a polyglycidyl ether of o-cresol novolak was obtained.

Physical properties of each novolak and polyglycidyl ether thereof obtained in the above Examples are summarized in the following Table 1.

TABLE 1

| Example No. | Phenol (% by weight) | Novolak Softening point (°C.) | Polyglycidyl ether | | | |
|---|---|---|---|---|---|---|
| | | | Epoxy equivalent (g/eq.) | Hydrolyzable chlorine content (% by weight) | Softening point (°C.) | Melt viscosity at 150° C. (CP) |
| 1 | 3M6B (100) | 89 | 260 | 0.02 | 90 | 295 |
| 2 | 3M6B(75)/o-cresol(25) | 94 | 245 | 0.03 | 86 | 460 |
| 3 | 3M6B(55)/o-cresol(45) | 108 | 232 | 0.04 | 92 | 880 |
| 4 | 3M6B(77)/phenol(23) | 95 | 240 | 0.04 | 88 | 520 |
| 5 | 3M6O (100) | 87 | 314 | 0.03 | 86 | 270 |
| Comparative 1 | o-Cresol (100) | 120 | 208 | 0.07 | 89 | 2200 |

EXAMPLES 6 to 10 and COMPARATIVE EXAMPLE 2

Each mixture as shown in Table 2 was kneaded for 6 minutes using a 100° C./50° C. double arm roller, then cooled and pulverized to obtain each epoxy resin composition.

Each epoxy resin composition obtained was transfer-molded for 10 minutes at 175° C. under 90 kg/cm², and then cured in an oven for 5 hours at 180° C.

Physical properties measured for each molded product are as shown in Table 2.

each varnish. The mixing weight proportions were as shown in Table 3.

The reactivity of the varnish obtained was as shown in Table 3.

A glass fiber (KS-1600, produced by Kanebo Glass Fiber Co.) was impregnated with the varnish obtained above, and then treated in an oven at 140° C. for 4

TABLE 2

| Example No. | | 6 | 7 | 8 | 9 | 10 | Comparative 2 |
|---|---|---|---|---|---|---|---|
| Polyglycidyl ether used | | Example 1 | Example 2 | Example 3 | Example 4 | Example 5 | Comparative Example 1 |
| Mixture | | | | | | | |
| Polyglycidyl ether | | 100 | 100 | 100 | 100 | 100 | 100 |
| Phenol novolak | | 43 | 45 | 47 | 46 | 35 | 53 |
| 2,4,6-Tris(dimethyl-aminomethyl)phenol | | 1 | 1 | 1 | 1 | 1 | 1 |
| Carnauba wax | | 1 | 1 | 1 | 1 | 1 | 1 |
| Silica treated with silane | | 334 | 343 | 348 | 345 | 320 | 362 |
| Physical properties | | | | | | | |
| Spiral flow value* | inch | 82 | 74 | 48 | 71 | 98 | 30 |
| 170° C. Gel time | sec | 140 | 112 | 70 | 93 | 161 | 38 |
| Heat distortion temperature (100 kg/cm²) | °C. | 148 | 155 | 159 | 162 | 129 | 184 |
| Tg | " | 164 | 169 | 172 | 171 | 133 | 188 |
| Volume (23° C.) | Ω-cm | $7.8 \times 10^{15}$ | $7.1 \times 10^{15}$ | $6.6 \times 10^{15}$ | $7.8 \times 10^{15}$ | $7.7 \times 10^{15}$ | $6.8 \times 10^{15}$ |
| Resistivity (150° C.) | " | $2.8 \times 10^{14}$ | $2.1 \times 10^{14}$ | $1.8 \times 10^{14}$ | $2.2 \times 10^{14}$ | $1.3 \times 10^{14}$ | $3.2 \times 10^{13}$ |
| (180° C.) | " | $3.1 \times 10^{13}$ | $2.6 \times 10^{13}$ | $2.9 \times 10^{13}$ | $5.6 \times 10^{13}$ | $2.4 \times 10^{13}$ | $2.3 \times 10^{13}$ |
| 121° C. PCT | | | | | | | |
| Water (24 hr) | % | 0.53 | 0.56 | 0.59 | 0.56 | 0.60 | 0.74 |
| Absorption (68 hr) | " | 0.56 | 0.58 | 0.65 | 0.61 | 0.64 | 0.81 |
| (160 hr) | " | 0.60 | 0.62 | 0.69 | 0.65 | 0.69 | 0.86 |
| Volume (24 hr) | Ω-cm | $3.6 \times 10^{14}$ | $3.3 \times 10^{14}$ | $2.8 \times 10^{14}$ | $3.2 \times 10^{14}$ | $3.1 \times 10^{14}$ | $1.2 \times 10^{14}$ |
| Resistivity (68 hr) | " | $3.4 \times 10^{14}$ | $3.1 \times 10^{14}$ | $2.0 \times 10^{14}$ | $3.0 \times 10^{14}$ | $2.4 \times 10^{14}$ | $6.8 \times 10^{18}$ |
| (160 hr) | " | $3.0 \times 10^{14}$ | $2.9 \times 10^{14}$ | $1.2 \times 10^{14}$ | $2.6 \times 10^{14}$ | $1.8 \times 10^{14}$ | $4.9 \times 10^{13}$ |

*According to EMMI 1-66 (Epoxy Molding Material Institute)

Tables 1 and 2 demonstrate the facts that the polyglycidyl ether in accordance with the present invention has a lower viscosity (see Table 1), and the present epoxy resin composition comprising the polyglycidyl ether has a lower viscosity (see the spiral flow value in Table 2) and a superior moisture resistance (see the water absorption and volume resistivity in Table 2), as compared with those of Comparative Examples.

EXAMPLES 11 to 15

Each mixture of a tetrabromobisphenol A type epoxy resin (Sumiepoxy ESB-500, produced by Sumitomo Chemical Co., epoxy equivalent 480 g/eq., bromine content 21% by weight), each polyglycidyl ether obtained in Examples 1 to 5, dicyandiamide and 2-ethyl-4-methylimidazol was uniformly dissolved in a mixture of acetone and ethyleneglycol monomethyl ether to obtain minutes to obtain a prepreg. 6 Sheets of the prepreg were put one over another and pressed for 90 minutes at 160° C. under 50 kg/cm² to obtain a laminate of 1 mm in thickness. The physical properties measured for the laminate were as shown in Table 3.

COMPARATIVE EXAMPLE 3

In a manner similar to that of Examples 11 to 15, provided that the polyglycidyl ether obtained in Comparative Example 1 was used, there were obtained a varnish and a laminate. The physical properties measured for the laminate were as shown in Table 3.

COMPARATIVE EXAMPLE 4

The manner of Examples 11 to 15 was repeated, provided that no polyglycidyl ether was used. The physical properties of the laminate obtained was also shown in Table 3.

TABLE 3

| Example No. | 11 | 12 | 13 | 14 | 15 | Comparative 3 | Comparative 4 |
|---|---|---|---|---|---|---|---|
| Polyglycidyl ether | Example 1 | Example 2 | Example 3 | Example 4 | Example 5 | Comparative 1 | — |
| Sumiepoxy ESB-500 | 80 | 80 | 80 | 80 | 80 | 80 | 100 |
| Polyglycidyl ether | 20 | 20 | 20 | 20 | 20 | 20 | 0 |
| Dicyandiamide | 5.2 | 5.3 | 5.4 | 5.4 | 4.9 | 5.6 | 3.4 |
| 2-Ethyl-4-methyl-imidazol | 0.33 | 0.33 | 0.33 | 0.33 | 0.33 | 0.2 | 0.3 |
| Acetone | 25 | 25 | 25 | 25 | 25 | 25 | 25 |
| Ethyleneglycol mono-methyl ether | 40 | 40 | 40 | 40 | 40 | 40 | 40 |
| 140° C. Gel time (sec.) | 494 | 490 | 467 | 471 | 502 | 446 | 467 |
| 160° C. Gel time (sec.) | 180 | 177 | 170 | 178 | 191 | 161 | 174 |
| Physical properties of laminate | | | | | | | |

TABLE 3-continued

| Example No. | | 11 | 12 | 13 | 14 | 15 | Comparative 3 | Comparative 4 |
|---|---|---|---|---|---|---|---|---|
| Tg (direction Z) | °C. | 154 | 150 | 147 | 152 | 148 | 142 | 132 |
| 2 Hour-boiling water absorption | % | 0.40 | 0.41 | 0.39 | 0.42 | 0.41 | 0.40 | 0.51 |
| 24 Hour-boiling water absorption | % | 1.29 | 1.31 | 1.33 | 1.32 | 1.33 | 1.39 | 1.53 |
| Copper foil 90° peeling strength | kg/cm | 2.3 | 2.3 | 2.0 | 2.3 | 2.3 | 2.0 | 2.1 |
| Volume resistivity (20° C.) | Ω-cm | $6.1 \times 10^{15}$ | $6.4 \times 10^{15}$ | $6.0 \times 10^{15}$ | $6.7 \times 10^{15}$ | $6.4 \times 10^{15}$ | $6.8 \times 10^{15}$ | $5.7 \times 10^{15}$ |
| Volume resistivity (150° C.) | Ω-cm | $6.6 \times 10^{11}$ | $4.4 \times 10^{11}$ | $2.8 \times 10^{11}$ | $5.9 \times 10^{11}$ | $4.1 \times 10^{11}$ | $1.2 \times 10^{11}$ | $1.3 \times 10^{10}$ |

Table 3 demonstrates the facts that the cured products produced using the epoxy resin composition in accordance with the present invention have the following characteristics superior to those of the comparative ones, and are useful industrially.

(1) Thermal resistance is superior. (This is apparent from the fact that Tg of the cured product of the present invention is higher.)

(2) Water resistance is superior. (Water absorption after the boil-treatment of the product for 24 hours is lower.)

(3) Electric characteristics are superior. (There is observed a great difference in the volume resistivity, particularly at 150° C.)

What is claimed is:

1. An epoxy resin composition comprising a polyglycidyl ether prepared by reacting a 3-methyl-6-alkylphenol in the presence or absence of a phenol other than the 3-methyl-6-alkylphenol with an aldehyde to obtain a novolak, and reacting the novolak with an epihalohydrin.

2. The composition according to claim 1, wherein the composition further contains at least one member selected from curing agents, curing accelerators, conventional epoxy resins, fillers, fire retardants, coloring agents, surface-processing agents and release agents.

3. The composition according to claim 2, wherein the curing agent is a member selected from dicyandiamide, hydrazides, novolaks, amines and acid anhydrides.

4. The composition according to claim 3, wherein the amount of the curing agent is from 0.5 to 1.5 equivalents per epoxy group of the polyglycidyl ether.

5. The composition according to claim 1, wherein the composition is the one prepared by melt-kneading the polyglycidyl ether, followed by cooling and pulverizing.

6. The composition according to claim 1, wherein the composition is a varnish prepared by dissolving the polyglycidyl ether in an organic solvent.

7. A polyglycidyl ether prepared by reacting a 3-methyl-6-alkylphenol in the presence or absence of a phenol other than the 3-methyl-6-alkylphenol with an aldehyde to obtain a novolak, and reacting the novolak with an epihalohydrin.

8. A product obtained by curing the epoxy resin composition of claim 1.

9. A method for encapsulating a semiconductor product, which comprises using the epoxy resin composition of claim 1.

10. A method for producing a printed circuit board, which comprises using the epoxy resin composition of claim 1.

* * * * *